United States Patent
Besling

(10) Patent No.: US 7,867,889 B2
(45) Date of Patent: Jan. 11, 2011

(54) METHOD OF FORMING AN INTERCONNECT STRUCTURE ON AN INTEGRATED CIRCUIT DIE

(75) Inventor: Wim Besling, Eindhoven (NL)

(73) Assignee: NXP B.V., Eindhoven (NL)

( * ) Notice: Subject to any disclaimer, the term of this patent is extended or adjusted under 35 U.S.C. 154(b) by 224 days.

(21) Appl. No.: 11/720,748

(22) PCT Filed: Nov. 24, 2005

(86) PCT No.: PCT/IB2005/053892

§ 371 (c)(1),
(2), (4) Date: Oct. 5, 2009

(87) PCT Pub. No.: WO2006/059261

PCT Pub. Date: Jun. 8, 2006

(65) Prior Publication Data

US 2010/0013098 A1      Jan. 21, 2010

(30) Foreign Application Priority Data

Dec. 1, 2004      (EP) .................................. 04300831

(51) Int. Cl.
*H01L 21/4763* (2006.01)
(52) U.S. Cl. ........................ 438/622; 438/513; 438/700; 257/E21.17; 257/E21.054; 257/E21.267; 257/E21.304; 257/E21.585

(58) Field of Classification Search ................ 438/622, 438/637, 513, 680, 700, 687, 931; 257/E21.17, 257/54, 267, 304, 585
See application file for complete search history.

(56) References Cited

U.S. PATENT DOCUMENTS

| | | | | |
|---|---|---|---|---|
| 5,804,505 A | * | 9/1998 | Yamada et al. | 438/643 |
| 6,077,771 A | | 6/2000 | Liao | |
| 6,927,159 B2 | * | 8/2005 | Faust et al. | 438/628 |
| 7,071,100 B2 | * | 7/2006 | Chen et al. | 438/643 |
| 7,148,089 B2 | * | 12/2006 | Hung et al. | 438/132 |
| 2004/0121616 A1 | | 6/2004 | Satta et al. | |

FOREIGN PATENT DOCUMENTS

EP      1102315 A2      9/2003

* cited by examiner

*Primary Examiner*—David Nhu

(57) ABSTRACT

A method of forming an interconnect structure, comprising forming a first interconnect layer (123) embedded in a first dielectric layer (118), forming a dielectric tantalum nitride barrier (150) by means of atomic layer deposition on the surface of the first interconnect (123), depositing a second dielectric layer (134) over the first interconnect (123) and the barrier (150) and etching a via (154) in the dielectric layer (134) to the barrier (150). The barrier (150) is then exposed to a treatment through the via (154) to change it from the dielectric phase to the conductive phase (180) and the via (154) is subsequently filled with conductive material (123).

8 Claims, 2 Drawing Sheets

METHOD OF FORMING AN INTERCONNECT STRUCTURE ON AN INTEGRATED CIRCUIT DIE

This patent application claims benefit under 35 U.S.C. §371 of national stage entry of International Application No. PCT/IB2005/053892 filed on Dec. 1, 2005 which claims priority benefit under 35 U.S.C. §119 of European Patent Application No. 04300831.7 filed on Nov. 24, 2004, to which priority is also claimed here.

FIELD OF THE INVENTION

This invention relates generally to a method of forming an interconnect structure on an integrated circuit die.

BACKGROUND OF THE INVENTION

Due to the constant shrinking of the critical dimensions in ULSI (ultra large scale integrated) circuits in order to improve speed, functionality and cost, delay and crosstalk related to the interconnection part of the circuit become limiting factors for speed and logical performance. The relatively recent move from Aluminium to Copper interconnects has yielded a 30% reduction in the resistance of wired connections on a chip.

Referring to FIG. 1 of the drawings, after a first copper metallization 23 has been formed in a dielectric layer 18, an inter-metal dielectric layer 25 is formed over the first copper metallization. When a via 27 or dual damascene opening is made through the inter-metal dielectric layer 25 to the underlying first copper metallization 23, some of the underlying copper is sputtered away and re-deposited (at 29) onto the sidewall of the via 27 or dual damascene opening. This causes contamination of the inter-metal dielectric layer 25. This problem arises when the copper lines are opened during and after the via etch. The SiC or SiCN barrier (not shown), which is usually used as a cap layer on top of the copper lines, has to be opened very carefully to avoid re-sputtering of the Cu on the sidewalls of the via.

In addition, during ash and cleaning of the opened vias, Cu contamination can easily occur, especially when an Argon RF-based pre-clean is employed, a significant amount of Cu re-sputtering on the via sidewall occurs. A reactive pre-clean (RPC) based on He/H$_2$ DC plasma is able to reduce CuO on the bottom of the vias with a minimum amount of re-sputtering. However, the removal of polymer residues is more of a problem with RPC, and potentially results in a loss of yield.

Therefore, a so-called "barrier fit" integration process has been proposed, in which the above-mentioned pre-clean step can be omitted. After via opening, a metallic barrier is deposited, followed by a re-sputter step to remove all barrier residues, where present, and any copper oxide at the bottom of the via. An additional thin barrier is then deposited to cover the unlanded or misaligned vias. However, the Cu contamination problem still remains during the via etching step.

European Patent Application No. EP-A-1102315 describes a method of preventing copper contamination of the inter-metal dielectric layer during via or dual damascene etching, in which a conductive capping layer is deposited overlying a copper metallization formed in a first inter-metal dielectric layer and overlying the surrounding first inter-metal dielectric layer. The capping layer is then removed except from the copper metallization and a second inter-metal dielectric layer is deposited over the capping layer, and a via is etched through the second inter-metal dielectric layer to the capping layer, such that the capping layer prevents contamination of the second inter-metal dielectric layer during etching. However, this type of barrier faces selectivity issues, since any metallic deposition in-between metal lines may increase capacitive coupling in-between metal lines, and additional integration development is required.

It is known in the art, if a barrier is selectively deposited on top of the metal lines as in the method described in EP-A-1102315, instead of the conventional full sheet SiC or SiCN films, the potential Cu contamination during via etching can be avoided. In addition, a significant improvement in the capacitive coupling can be achieved because the SiC or SiCN capping and etch stop layer is omitted.

Current integration schemes of self-aligned metallic barriers are mostly based on selective processes such as metallic Tungsten CVD or electrolessly deposited alloys (CoWP, etc). These barriers should have a barrier performance as good as the conventional dielectric capping in terms of adhesion and mechanical strength, resistance to stress-induced voiding and electromigration, with an effective efficiency against copper diffusion and corrosion. Although the electroless deposited films show improved reliability performance compared to a SiC capping and the like, a fairly thick film needs to be deposited to obtain the desired Cu diffusion barrier properties. Moreover, these barriers also face selectivity issues, since (as explained above) any metallic deposition in-between metal-lines may further degrade leakage current properties and additional integration development is required. In addition, the electroless grown films generally tend to grow in a lateral direction thereby reducing the dielectric spacing and increasing the capacitive coupling between the lines. As an alternative, a novel barrier (CuSiN) has recently been proposed that is based on copper surface modification, which alleviates the selectivity concern, while being equivalent in terms of propagation performances to other selectively deposited barrier techniques. The main concern with this approach remains the potential Cu re-sputtering on the via sidewalls prior to barrier deposition and the potential increase of line resistance.

SUMMARY OF THE INVENTION

It is therefore an object of the present invention to provide a method of forming an interconnect structure on an integrated circuit die, whereby copper contamination of the inter-metal dielectric layer is avoided, as is the formation of potential leakage paths if the 100% selectivity of deposited metallic barriers according to the prior art techniques is not attained.

According to the present invention, there is provided a method of forming an interconnect structure on an integrated circuit die, the method comprising selectively depositing a dielectric barrier on a surface of a first conductive interconnect embedded in a first dielectric layer, depositing a second dielectric layer over said first dielectric layer and said dielectric barrier, etching a via in said second dielectric layer to said dielectric barrier, performing a process to transform said dielectric barrier material to a conductive material so as to form a conductive connecting portion, and introducing a conductive material into said via etched in said second dielectric layer to form a second conductive interconnect.

The present invention also extends to an integrated circuit die including an interconnect structure formed according to the method defined above.

Thus, because the barrier layer, when it is deposited, is a dielectric, the above-mentioned problems which can arise when 100% selectivity is not attained in the deposition of metal barriers, as in the prior art, are not encountered. Only the part of the barrier actually required to be made conductive is exposed to the chemical transformation process (through the via) so only that part of the barrier will be made conductive and any barrier material spuriously deposited between the interconnects will remain dielectric and will, therefore, not contribute to capacitive coupling in the structure.

In one exemplary embodiment, the dielectric barrier is deposited by means of an atomic layer deposition process, by means of which atomic scale control over the growth rate and selectivity of the deposition process can be achieved.

In another exemplary embodiment, prior to transformation of the first dielectric barrier layer to a conductive material, a second dielectric barrier layer is deposited on the side walls of the via. This has the advantage that the low-k permittivity of the second dielectric layer is not affected during the transformation process. Furthermore, any eventual re-sputtering of the conductive interconnect will not have a deteriorating effect on the second dielectric layer. In one embodiment, the second dielectric barrier layer may be deposited (by, for example, ALD or CVD) over the sidewalls of the via and the first dielectric barrier layer, following which the second dielectric layer over the first dielectric barrier layer only is removed or transformed into a conductive layer, leaving a dielectric barrier layer on the sidewalls of the via.

The dielectric barrier is beneficially tantalum nitride which is initially deposited on a surface of the conductive interconnect in its non-conductive $Ta_3N_5$ phase. Tantalum nitride is a well-known barrier material which is known to have an excellent barrier performance against Cu diffusion. Moreover, tantalum nitride barriers are relatively easily integrated in existing process flows. Upon depositing tantalum nitride from the vapor phase, the non-conductive $Ta_3N_5$ phase is always obtained because of the low deposition temperatures usually encountered in atomic layer deposition processes.

The interconnects are beneficially formed of copper, for the reasons set out above, and the first and second dielectric layers may comprise a silicon oxide based dielectric, such as SiOC or the like. The $Ta_3N_5$ phase can be transformed, for example, by a plasma treatment such as a soft argon plasma treatment, into the conductive TaN phase, which is of course important when a low resistance connection needs to be made between the interconnects of a first level of the structure and the respective interconnects of the level above.

These and other aspects of the present invention will be apparent from, and elucidated with reference to, the embodiments described herein.

BRIEF DESCRIPTION OF THE DRAWINGS

Embodiments of the present invention will now be described by way of examples only and with reference to the accompanying drawings, in which.

DETAILED DESCRIPTION OF THE INVENTION

Thus, the object of the present invention is achieved by the selective deposition of a dielectric barrier on the (preferably copper) interconnect lines as opposed to a metallic barrier. This avoids any contribution to capacitive coupling in between the lines if the required 100% selectivity is not attained.

Atomic Layer Deposition (ALD) is the preferred deposition technique for depositing the barrier layer due to the atomic scale control over the growth rate and the selectivity of this deposition process. Some other advantages of the ALD deposition process include a uniform and conformal deposition. The chosen barrier material is tantalum nitride because it is a well-known barrier material with an excellent barrier performance against Cu diffusion. Moreover, tantalum nitride barriers are easily integrated in existing process flows.

When tantalum nitride is deposited from the vapor phase using ALD the non-conductive $Ta_3N_5$ phase is always obtained due to the low deposition temperatures normally encountered in Atomic Layer Deposition. The formation of this dielectric phase is independent of the precursor choice (metal-organic or halides). The growth behavior of the film depends, however, on the actual bonding state of the surface. It has been observed that the amount of Ta that is deposited on a Cu surface is 50 to 20 times larger than on CVD SiOC type materials after 20 to 100 respective cycles of sequential precursor exposure, showing the selectivity of the deposition process towards copper.

Figure 1:
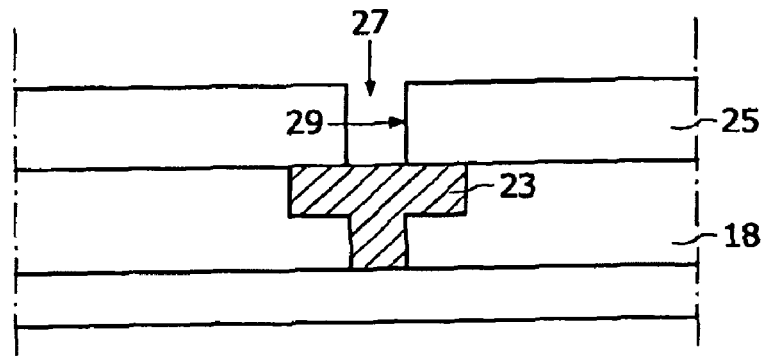
FIG. 1 is a schematic cross-sectional view of an interconnect structure according to the prior art.
Figure 2A:
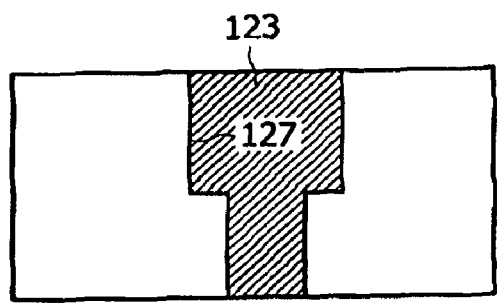
FIGS. 2a and 2b are schematic cross-sectional views illustrating a method of forming an interconnect structure according to the present invention.
Figure 2B:
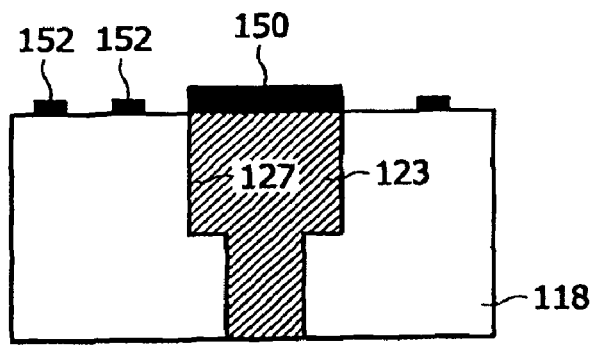

Referring to FIG. 2a of the drawings, after copper 123 has been deposited in the via 127 and chemical-mechanical polishing (CMP) has been performed in accordance with standard practice, ALD barrier layer 150 is deposited on top of the metal line 123 and dielectric. ALD is a known surface controlled layer-by-layer process for depositing films with atomic layer accuracy. HF cleaning will remove Si—OH bonds that may participate in undesired precursor adsorption on the SiOC dielectric 118. Atomic Layer Deposition is preferably carried out in a temperature window between 200° C. and 275° C. by using pentalis-dimethyl amido tantalum (PD-MATP and $NH_3$ as precursors. Precursor exposure times are typically longer than 0.3-0.5 sec per pulse to allow full saturation of all reactive sites. After 100 cycles of exposure a film thickness of about 5 nm is obtained on copper, which is sufficient for capping purposes. Due to the large selectivity towards copper, the copper lines 123 will be substantially completely covered with the $Ta_3N_5$ dielectric barrier 150. Only very small amounts of $Ta_3N_5$ will be deposited in between the lines on the SiOC dielectric (<1e15 at/cm2). The islands (152—see FIG. 2b) of $Ta_3N_5$ are not connected and are isolating anyway, so they do not contribute to capacitive coupling.

The selectivity for precursor adsorption originates from the low amount of reactive surface groups on the SiOC surface 118 (presence of predominantly unreactive methyl groups). Hence, a small amount of precursor molecules will be chemisorbed on the SiOC surface compared to copper during the initial stages of growth thus explaining the selectivity of the ALD process. If a large number of cycles is applied on SiOC, the deposition will take place predominantly on material that has been deposited already and an island-like type of growth behavior will occur. If the initial density of active surface groups is small, it will take a large number of cycles before the islands touch each other. In FIG. 2 the surface coverage is shown of the ALD film as function of different surface pre-treatments. The application of an argon or a hydrogen plasma can enhance the number of initial adsorption sites. As long as any plasma surface treatments are avoided the growth rate per cycle will stay small. Therefore, as long as the thickness of the selective dielectric cap is not too thick, the inter-line capacitance is minimized. Note that the leakage current is never a concern because of the isolating nature of the $Ta_3N_5$ phase.

Ta₃N₅ as dielectric barrier material can thus selectively be deposited on the copper lines. The $Ta_3N_5$ phase can be transformed by a soft argon plasma treatment into the conductive TaN phase. This is important when a low resistive connection has to be made to a metal level above. The effect of the argon plasma on the film composition has been studied. It has been demonstrated that the Ta/N ratio is reduced from 1.6 to 1.1 by applying a 120 sec Ar plasma at 300 W AC bias. The resistivity of barrier film was significantly reduced as was evidenced by parametrical test results on via chains.

However, it will be appreciated that there are a whole range of plasma conditions which can be employed (e.g. direct/remote, different chemistries, different power, different times, etc) and it will be apparent to a person skilled in the art that suitable conditions to be employed will be dependent on several factors. For example, even the plasma used during the etching process may be able to transform a ALD $Ta_3N_5$ capping layer into a conductive layer, it depends on the thickness of the ALD $Ta_3N_5$ film that needs to be transformed If the thickness is relatively small (say <5 nm), mild plasmas can be used to effect the transformation process. If, however, the thickness is greater than 5 nm (which is preferable from the perspective of its role as etch stop during the via etching process), then different plasma conditions may be necessary for the transformation process. Of course, on the other hand, it is preferred to make the film as thin as possible to avoid damage to low-k sidewalls and to avoid dielectric $Ta_3N_5$ deposition in between the lines (and thereby keeping capacitive coupling to a minimum.

Figure 3A:
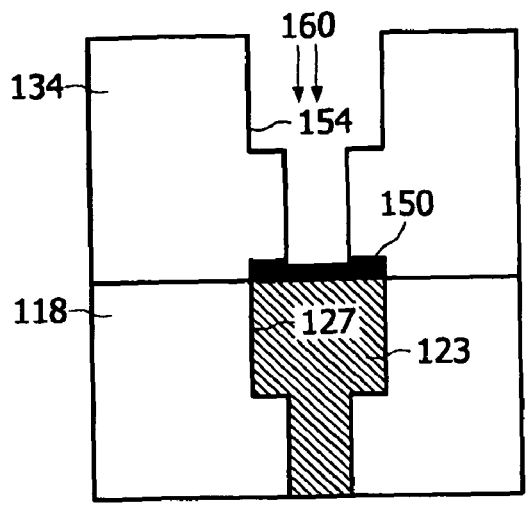
FIGS. 3a to 3c are schematic cross-sectional views illustrating a method of forming an interconnect structure according to the present invention.

Referring to FIG. 3a of the drawings, after the capping procedure, the low-k dielectric 134 for the next metal (interconnect) level is deposited (e.g. a CVD SiOC film). After via and line patterning 160 the vias 154 are etched until the $Ta_3N_5$ cap 150 is reached. The etch stops on the bottom of the via 154 without any chance of re-sputtering or contamination of the low-k dielectric 134.

At this point, another dielectric barrier layer (not shown) may be deposited (by, for example, ALD or CVD) on the side walls of the vias 154 and on the $Ta_3N_5$ cap 150, following which, this dielectric layer must be etched to punch through to the $Ta_3N_5$ cap 150 or transformed into a conductive layer, leaving a dielectric barrier layer on the sidewalls of the vias 154. The advantage of this barrier layer is that the subsequent plasma treatment to transform the $Ta_3N_5$ cap 150 into the metallic phase will not affect the low-k permittivity of the dielectric layer 134. Also, this results in a permanent barrier on the side walls of the vias 154 such that any eventual Cu re-sputtering will not have a deteriorating effect.

Figure 3B:
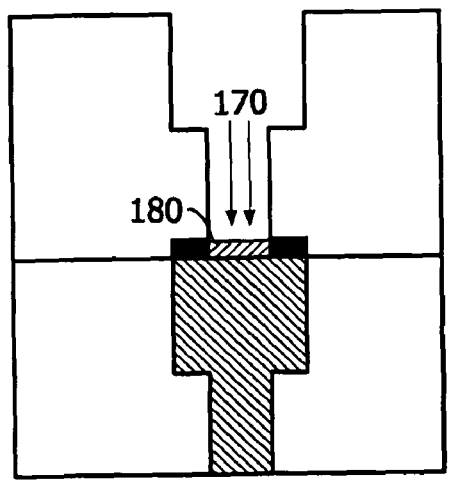

The dielectric $Ta_3N_5$ barrier 150 is then transformed into a metallic TaN barrier 180 by applying a soft Argon plasma treatment 170 for 120 sec at 300 W, as shown in FIG. 3b. The barrier and seed can be deposited as usual in the dual damascene structures with or without barrier re-sputtering step. The advantage of using this approach is that there is no chance for copper contamination because the copper lines are fully encapsulated.

Figure 3C:
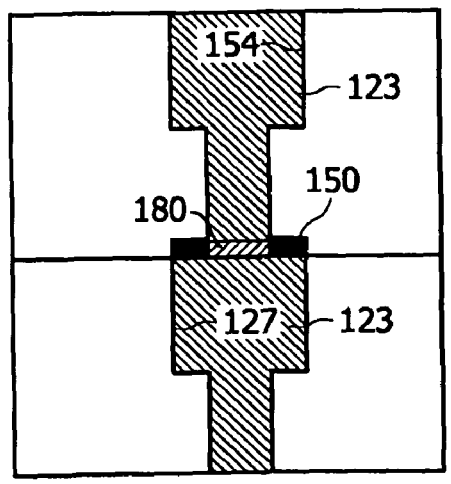

Finally, as shown in FIG. 3c, copper 123 is deposited in the via 154 and CMP is performed in accordance with standard practice.

The advantages of this integration approach are the following.

Cu re-sputtering on via and trench side wall is avoided due to etch stop on dielectric capping layer.

Argon pre-clean can be performed to remove polymer residues from the sidewalls without risk of Cu re-sputtering. Any re-sputtered $Ta_3N_5$ material on the sidewall will be transformed into the conductive TaN phase.

A single etch step can be used instead of two because the etch stop is less critical. The conventional SiCiN etch process requires a lot of tuning to stop at the moment when the copper lines are opened.

The effective k-value of the dielectric decreases because the bottom SiC. SiN layer of the above-mentioned conventional process can be omitted from the integration scheme described above.

In most cases, wet cleans may be used to remove etch residues and copper on the sidewalls of the vias. Using cleaning liquids is highly disadvantageous if porous low-k materials are used in prior art processes, because the liquid (with dissolved copper) can easily penetrate inside the dielectric, thereby inevitably degrading the dielectric properties. The wet clean can be replaced in the process of the present invention by soft sputter clean $Ar^+$ to remove residues. If a wet clean is still needed, it contains at least no copper.

Another problem with SiN and SiC plasma deposited barriers of the prior art, is the bad interface between the copper lines and the barrier on top. This bad interface causes early failures due to a decreased electromigration resistance, and this problem is overcome by the prior art.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of forming an interconnect structure on an integrated circuit die, the method comprising:

selectively depositing a dielectric barrier on a surface of a first conductive interconnect embedded in a first dielectric layer, depositing a second dielectric layer over said first dielectric layer and said dielectric barrier, etching a via in said second dielectric layer to said dielectric barrier, performing a process to transform material in said dielectric barrier to a conductive material so as to form a conductive connecting portion, and introducing another conductive material into said via etched in said second dielectric layer to form a second conductive interconnect.

2. A method according to claim 1, wherein the dielectric barrier is deposited by means of an atomic layer deposition process.

3. A method according to claim 1, wherein prior to said transformation process, another dielectric barrier is deposited at least on the side walls of the via.

4. A method according to claim 1, wherein the dielectric barrier is tantalum nitride which is initially deposited on a surface of the conductive interconnect in its non-conductive $Ta_3N_5$ phase.

5. A method according to claim 1, wherein said first and second conductive interconnects are formed of copper.

6. A method according to claim 1, wherein the first and second dielectric layers comprise a silicon oxide based dielectric.

7. A method according to claim 4, wherein said $Ta_3N_5$ phase of the dielectric barrier is subsequently transformed by a plasma treatment, into the conductive TaN phase.

8. An integrated circuit die including an interconnect structure formed according to the method of claim 1, wherein the step of etching to said dielectric barrier results in an etched upper surface of the conductive material as transformed.

* * * * *